US006848198B2

(12) United States Patent
Yamaguchi

(10) Patent No.: US 6,848,198 B2
(45) Date of Patent: Feb. 1, 2005

(54) HEAT TREATMENT APPARATUS AND METHOD OF HEAT TREATMENT

(75) Inventor: Yuko Yamaguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/730,667

(22) Filed: Dec. 8, 2003

(65) Prior Publication Data

US 2004/0187344 A1 Sep. 30, 2004

(30) Foreign Application Priority Data

Dec. 11, 2002 (JP) ........................................ 2002-359661

(51) Int. Cl.[7] .................................................. F26B 3/00
(52) U.S. Cl. ............................. 34/619; 34/195; 34/480; 34/72; 34/74; 34/79
(58) Field of Search ........................... 34/195, 619, 452, 34/480, 72, 73, 74, 75, 79, 80, 81, 639

(56) References Cited

U.S. PATENT DOCUMENTS

| 4,656,757 A | * | 4/1987 | Oschmann | .................... 34/473 |
| 4,870,760 A | * | 10/1989 | Graff | ............................ 34/473 |
| 5,390,428 A | * | 2/1995 | Pummell | ...................... 34/273 |

* cited by examiner

*Primary Examiner*—Kenneth Rinehart
(74) *Attorney, Agent, or Firm*—Sonnenschein, Nath & Rosenthal LLP

(57) ABSTRACT

A heat treatment apparatus for preventing quality defects of an object to be heat-treated even when sublimating components produced in heat treatment become solids and drop down in the heat treatment apparatus, wherein a gas generated when heating an object to be heat-treated, coated with a coating solution and placed on a stage is passed through a trap made of a permeable porous film and is exhausted from an exhaust port of a cover and wherein solids produced and dropping down when gas passed through the trap of the permeable porous film solidifies at a top plate of the cover are trapped by the trap.

18 Claims, 6 Drawing Sheets

HEAT TREATMENT APPARATUS AND METHOD OF HEAT TREATMENT

RELATED APPLICATION DATA

The present application claims priority to Japanese Application(s) No(s). P2002-359661 filed Dec. 11, 2003, which application(s) is/are incorporated herein by reference to the extent permitted by law.

BACKGROUND OF THE INVENTION

1. Field of the Invention

The present invention relates to a heat treatment apparatus and a method of heat treatment, more particularly relates to a heat treatment apparatus in the process of production of semiconductor chips or liquid crystal display (LCD).

2. Description of the Related Art

In the process of production of semiconductor chips, an LCD, etc., a wafer or substrate is given desired patterns by utilizing photolithography for removing unnecessary portions. In photolithography, the unnecessary portions other than the desired patterns are generally removed by etching using a chemical. On the other hand, the required portions are protected by a photoresist, so remain even after the etching and thereby can give the desired patterns. Photolithography is used for forming for example circuit patterns on a wafer for semiconductor chips and is used for forming indium-tin oxide (ITO) and other patterns on a substrate for an LCD.

An example of photolithography will be schematically explained below step by step. First, a coating solution containing photoresist film components is coated on for example a wafer by spin coating or another method. The wafer coated by the coating solution is heat treated as an object to be heat-treated whereby the solvent in the coating solution is evaporated away and a uniform photoresist film is formed. This heat treatment will be referred to as "pre-baking". Then, the photoresist film is developed by being exposed by UV rays or the like using a mask having desired patterns formed therein. Then, for example, the exposed portions are dissolved away by a chemical. On the other hand, the unexposed portions are polymerized and are not dissolved or hard to be dissolved in the chemical, so remain. In this way, the resist patterns are developed. Then, the photoresist film forming the resist patterns is further heat treated in order to bond it with the wafer. This heat treatment will be referred to as "post-baking". Next, this is etched to remove the unnecessary portions other than the portions protected by the resist patterns. Thereafter, the resist patterns are peeled away, whereby the desired patterns are formed on the wafer.

As explained above, in this series of photolithography steps, pre-baking, post-baking, and other heat treatment are carried out by using a heat treatment apparatus. FIG. 6 is a schematic vertical sectional view of a heat treatment apparatus. The heat treatment apparatus is provided with a stage 1 for placing a wafer W or other heated object on which the coating solution is coated and a heating unit 2 for heating the object to be heat-treated and the coating solution. The space above this stage 1 is covered by a cover portion 3 having a body 3a and a top plate 3b. The cover portion 3 is formed with an exhaust port 4 for exhausting the solvent and other volatile components generated from the heated object by the heat treatment to the outside of the heat treatment apparatus. This exhaust port 4 is connected to an exhaust duct of an exhaust treatment system etc. for treating the volatile components.

When using a heat treatment apparatus for heat treatment, the following disadvantages exist. When placing a wafer W on which the coating solution containing the photoresist film components is coated is placed on the stage 1 and heated by a heater 2a of the heating unit 2, the solvent component in the coating solution is volatilized due to the heating. This coating solution includes sublimating components such as low molecular-weight components of the photoresist film material. For this reason, also the sublimating components subliminate along with the volatilization of the solvent component. Then, the gaseous mixture of this sublimating components and the volatilizing components is exhausted to the outside of the heat treatment apparatus from the exhaust port 4. When it is sent to the exhaust port 4, the sublimating components sometimes stick to the top plate 3b or the like and become solids. Then, the solids sticking to the top plate 3b or the like sometime drop down to the wafer W or the stage 1 to be heat treated and cause defects in pattern formation etc. For this reason, they sometimes becomes a cause of a drop in the yield of the semiconductor chips (or LCD) or a drop in the reliability. Further, when gas containing the sublimating components is exhausted from the exhaust port 4, in the same way, since the gas is cooled inside the exhaust duct, the exhaust treatment apparatus, etc., it sometimes becomes a solid. As a result, the exhaust duct and the exhaust treatment apparatus become fouled, and the exhaust treatment efficiency was sometimes lowered.

In order to avoid the present disadvantage, the heat treatment apparatus has been periodically subjected to a maintenance routine or a material producing little sublimating components has been selected in the design of the photoresist film to be used. In the former periodic maintenance, for example, the work of replacing or washing the top plate 3b and other parts of the cover portion 3 or washing the exhaust duct and the exhaust treatment apparatus has been performed. However, this work is troublesome, so is not easy, and further the heat treatment apparatus had to be stopped during the work, so the production efficiency was sometimes lowered. Further, in the latter material design of the photoresist film, while reduction of the sublimating components was possible, it was difficult to completely eliminate them. In this way, periodic maintenance was indispensable, so a drop in the production efficiency occurred.

Various inventions have been proposed with respect to these disadvantages (for example, Japanese Unexamined Patent Publication (Kokai) No. 2000-173883), but none were sufficient.

Summarizing the disadvantage to be solved by the invention, as explained above, in the above heat treatment apparatus, sometimes the sublimating substances generated by the heat treatment became solids and dropped down causing poor quality and a decline in the yield of the product. For example, in the photolithography of semiconductor chips or LCDs, when the wafer or substrate on which the coating solution containing the photoresist film components was coated was heat treated, after the sublimating components produced due to the heat treatment became solids, the solids sometimes dropped down to the wafer causing defects in pattern formation. Further, a drop in the yield of the semiconductor chips or LCDs and a decline in the reliability sometimes occurred. To prevent the sublimating components from falling to the wafer or substrate, periodic maintenance of the heat treatment apparatus became necessary resulting in a drop in the production efficiency.

SUMMARY OF THE INVENTION

An object of the present invention is to provide a heat treatment apparatus and method of heat treatment able to prevent an object to be heat-treated from causing the quality defects and thereby improve the yield of the product and to improve the reliability of the product even in a case where the sublimating components produced due to heat treatment become solids and drop down. Another object of the present invention is to provide a heat treatment apparatus and method of heat treatment able to facilitate the periodic maintenance and raise the production efficiency.

In order to achieve the above objects, according to the present invention, there is provided a heat treatment apparatus comprising: a stage for placing an object to be heat-treated and coated by a coating solution; a heating unit for heating the object placed on the stage and coated by the coating solution from beneath the stage; a cover portion having a body provided at surrounding sides of the stage, a top plate for closing an upper opening of the body, and an exhaust port from which a gas generated from the coating solution due to the heating of the object is exhausted and covering the object placed on the stage; and a trap provided between the stage and the top plate, passing the gas generated from the coating solution due to the heating of the object therethrough, and trapping the solids solidified and dropping down after the passage, wherein the exhaust port is located above the location where the trap is provided.

In order to achieve the above objects, according to the present invention, there is provided a method of heat treatment using a heat treatment apparatus, said apparatus comprising a stage for placing an object to be heat-treated and coated by a coating solution; a heating unit for heating the object placed on the stage and coated by the coating solution from beneath the stage; a cover portion having a body provided at surrounding sides of the stage, a top plate for closing an upper opening of the body, and an exhaust port from which a gas generated from the coating solution due to the heating of the object is exhausted and covering the object placed on the stage; and a trap provided between the stage and the top plate, passing the gas generated from the coating solution due to the heating of the object therethrough, and trapping the solids solidified and dropping down after the passage, the exhaust port being located above the location where the trap is provided, said method comprising the steps of: placing the object to be heat-treated on the stage; and heating the object, to thereby pass a gas generated from the coating solution by the heating through the trap, and trap the solids solidified on a dropping down.

According to the present invention, the object coated by the coating solution is placed on the stage, then the object placed on the stage and coated by the coating solution is heated from beneath the stage by using the heating unit. At this time, the gas generated from the coating solution due to the heating of the object passes through the trap and is exhausted from the exhaust port of the cover portion. The solids solidified at the top plate of the cover and dropping down after the gas passes through the trap are trapped by the trap.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, an explanation will be given of preferred embodiments of the present invention with reference to the drawings.

Figure 4:
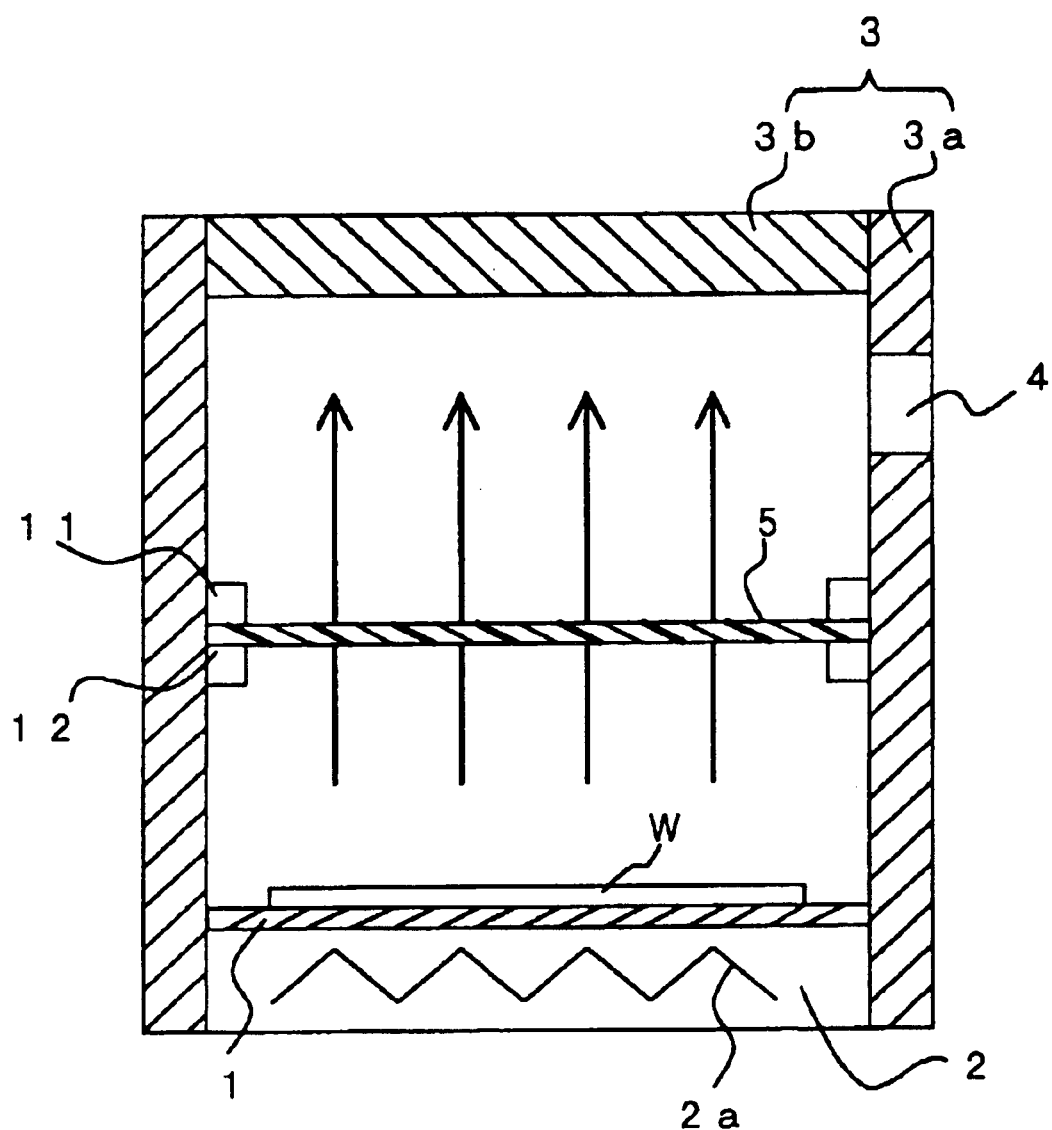
FIG. 4 is a schematic sectional view of a fourth embodiment of the present invention.
Figure 5:
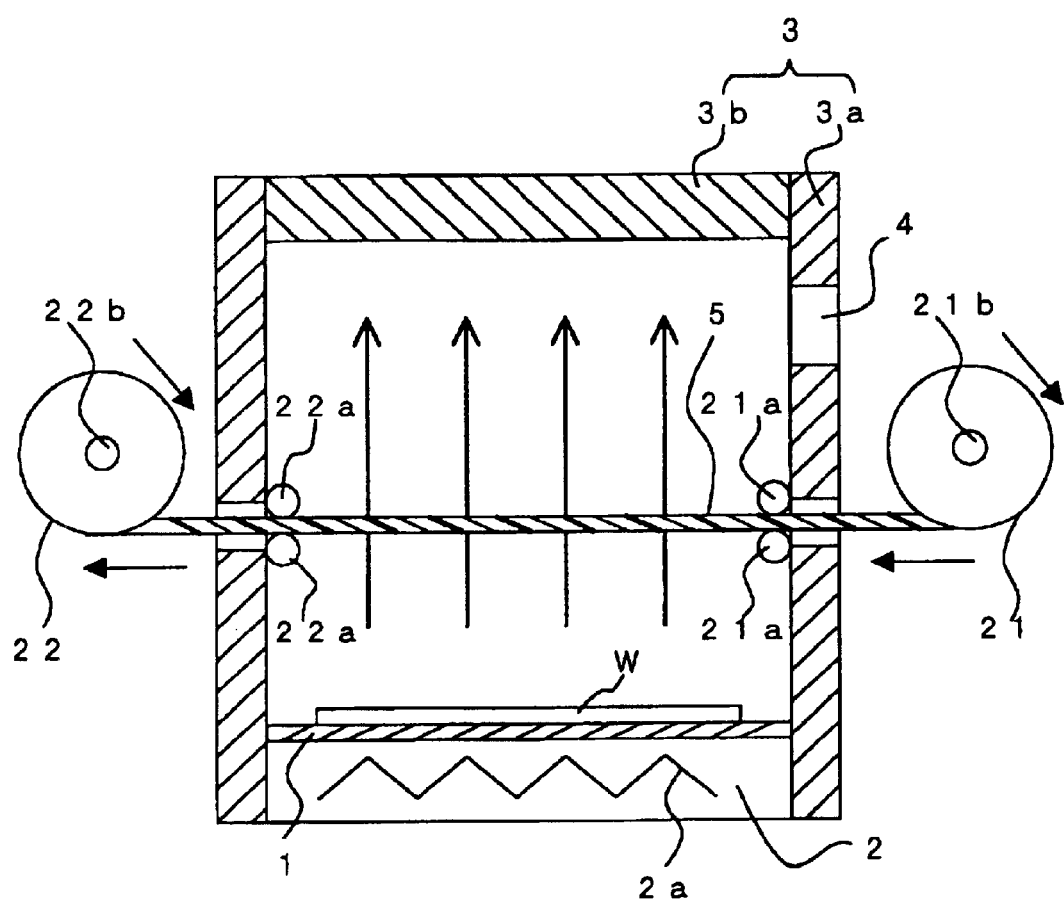
FIG. 5 is a schematic sectional view of a fifth embodiment of the present invention.
Figure 6:
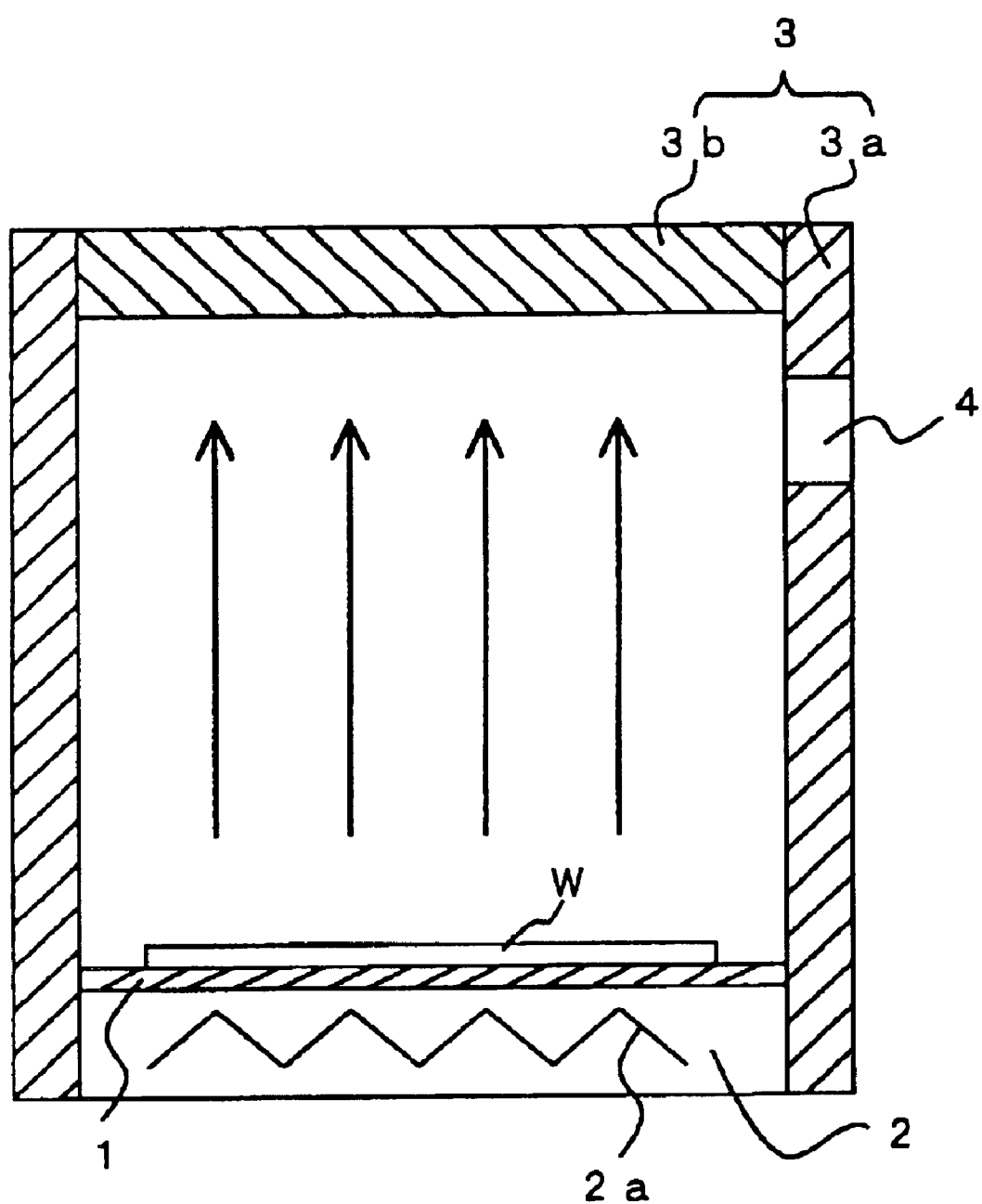
FIG. 6 is a schematic sectional view of a heat treatment apparatus.

FIG. 1 to FIG. 5 show embodiments of the present invention. In the figures, portions assigned the reference numerals as those of FIG. 6 represent the same elements. The basic configuration is the same as the heat treatment apparatus shown in FIG. 6.

First Embodiment

Figure 1:
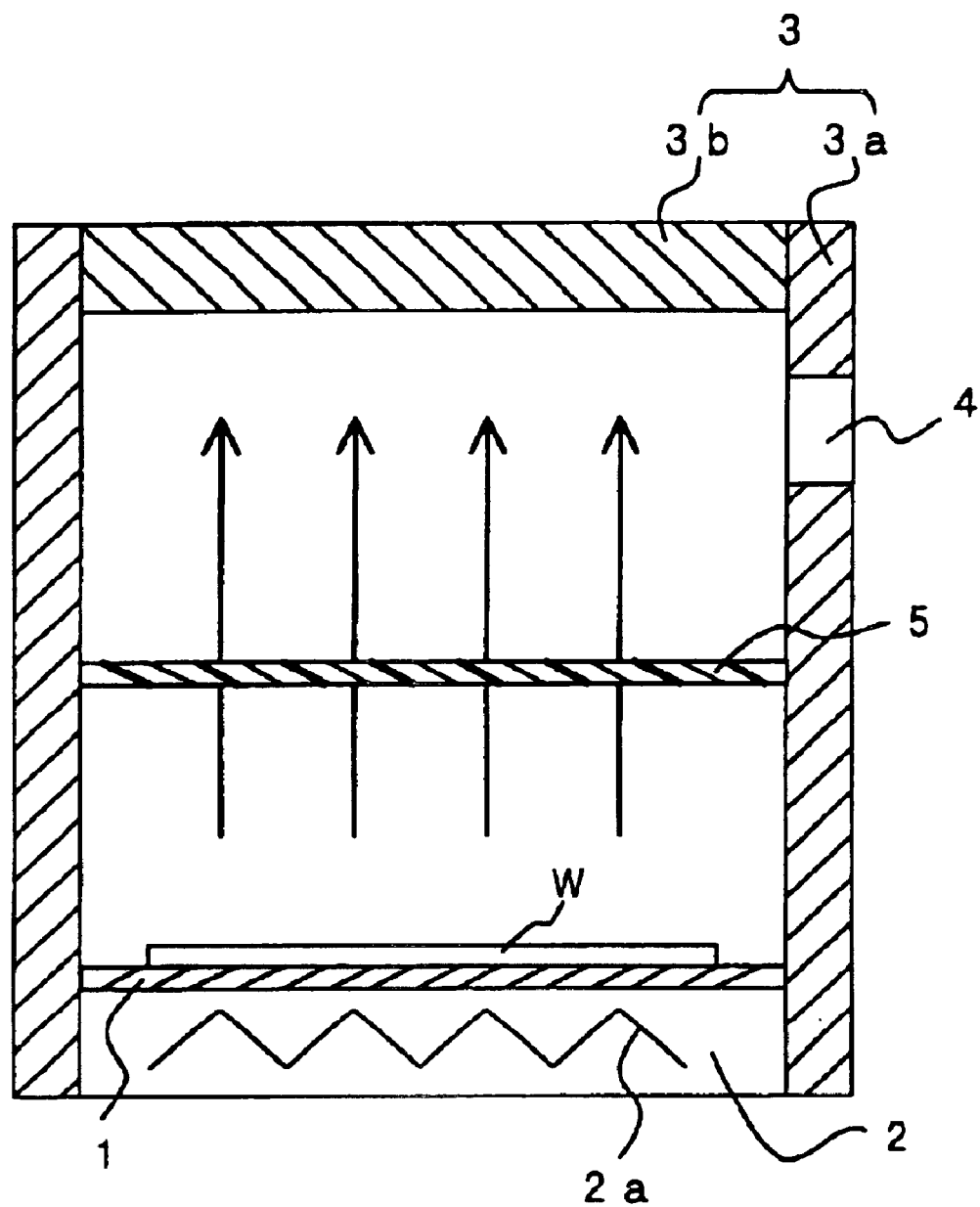
FIG. 1 is a schematic sectional view of a first embodiment of the present invention.

FIG. 1 is a schematic vertical sectional view of a heat treatment apparatus according to a first embodiment of the present invention. The heat treatment apparatus according to the first embodiment is provided with a stage 1, a heating unit 2, a cover portion 3, an exhaust port 4, and a trap 5. Here, the stage 1 places a wafer W or other heated object coated with a coating solution. Further, the heating unit 2 has a heater 2a for heating the object placed on the stage 1 and the coating solution from below. The cover portion 3 has a body 3a provided at the surrounding sides of the stage 1 and a top plate 3b for closing the upper opening of the body 3a and covers the object placed on the stage 1. The trap 5 is provided inside the cover portion 3 between the stage 1 and the top plate 3b, passes the gas generated from the coating solution due to the heating of the object, and traps the solids formed by the gas solidifying after passage and dropping down. The exhaust port 4 is provided in the cover portion 3 above the location where the trap 5 is provided. Note that the stage 1, the heating unit 2, the cover portion 3, the exhaust port 4, and the trap 5 in the present embodiment correspond to the stage, the heating unit, the cover portion, the exhaust port, and the trap in the present invention.

Below, the components will be explained in detail. The stage 1 is provided so as to place a wafer W or other heated object coated with a coating solution (not illustrated). For example, as the method of placing the wafer W on the stage 1, there are the contact baking system and proximity baking system. The former contact baking system brings the entire surface of the wafer W into contact with the entire surface of the placing surface of the stage for heating. The contact baking system is characterized in that the entire surface of the wafer W is contacted at a uniform temperature, so the temperature distribution in the plane of the wafer W surface can be made uniform. On the other hand, the proximity baking system arranges a plurality of pins or the like at the stage 1 to provide a gap between the wafer W and the heating surface for the heating. The proximity baking system is characterized in that defects in production due to charging of the wafer W can be prevented since the object is not directly carried on the surface to be heated. The desired carrying system is selected and employed by taking these characteristic features into account according to the target of the heat treatment. Other desired placing methods may be employed as well according to the shape of the object.

The heating unit 2 has the heater 2a for heating the wafer W placed on the stage 1 and coated with the coating solution.

The heater 2a is controlled by a thermostat and heats the placing surface of the stage 1 to and maintains it at a predetermined temperature. The thermostat keeps the heating temperature constant by controlling the heater 2a based on for example data detected at a temperature sensor.

The cover portion 3 has a body 3a provided at the surrounding sides of the stage 1 and a top plate 3b for closing the upper opening of the body 3a. The cover portion 3 covers the object placed on the stage 1 to prevent foreign substances from entry from the outside and maintain the heating temperature. The cover portion 3 is provided with its body 3a cylindrically rising from around the heating unit 2 and with its top plate 3b formed as a disk when for example the heating unit 2 is disk shaped. Other than this, the cover portion 3 may be provided in a box shape too. The body 3a and the top plate 3b may be welded together or may be integrally formed. However, the top plate 3b is desirably detachably formed in order to enable maintenance such as washing after heat treatment.

Note that the stage 1 or the cover portion 3 for example functions to rise to open or descend to close for loading and unloading the object to be heat-treated. The object is placed on the stage 1 exposed by the rising action by using a robot arm or other conveying means and then subjected to the heat treatment.

The exhaust port 4 is provided in the cover portion 3 above the location where the trap 5 is provided. The exhaust port 4 is formed for example in the body 3a near the top plate 3b as shown in the figure. The exhaust port 4 is connected to the exhaust duct in order to exhaust the gas generated from the coating solution at the time of heat treatment. The gas generated due to the heat treatment is exhausted through the exhaust duct linked to the exhaust port 4 and treated by an exhaust treatment apparatus or the like.

The trap 5 is formed between the stage 1 and the top plate 3b. The trap 5 passes the gas generated from the coating solution due to the heating of the object and traps the solids resulting from the gas solidifying after passage and dropping down. For this reason, as the trap 5, use is made of for example a permeable porous substance. The permeable porous substance has pores passing straight through it from front to back, that is, continuous pores, and passes the gas. The permeable porous substance is used in cylindrical, film like, or other desired shape. Among such permeable porous substances, use is made of an easy-to-handle film of the permeable porous substance. Concretely, as the permeable porous film, preferably use is made of a film formed by drawing, foaming, extraction, or another method using for example polyethylene, polypropylene, or another polyolefin-based resin, acetylcellulose or another cellulose-based resin, polytetrafluoroethylene or another fluorocarbon resin, a polyamide-based resin, or other organic polymer materials. When heat treating at a high temperature (for example, 250° C.), a permeable porous film using a fluorocarbon resin is preferred. This is because a fluorocarbon resin is excellent in heat resistance and chemical resistance and therefore there is little change in the film due to a high temperature atmosphere at the time of heat treatment and little change in the film due to the volatile components etc. For this reason, in the present embodiment, use is made of a fluorocarbon resin for the permeable porous film. By using a fluorocarbon resin for the permeable porous film, it becomes possible to lengthen the cycle for replacing the permeable porous film and facilitate maintenance of the apparatus. Note that, here, a "fluorocarbon resin" is an organic polymer material having a C—F bond. For example, polytetrafluoroethylene, a tetrafluoroethylene-hexafluoropropylene copolymer, polyvinyl fluoride, and polyvinylidene fluoride may be mentioned.

Further, the thickness, pore size, and air permeability of the permeable porous film can be desirably set according to the heat treatment conditions such as the heat treatment temperature, heat treatment time, and properties of the coating solution. When the permeable porous film is thin, the number of continuous pores increases, so the permeability is improved, but the pressure resistance and other aspects of mechanical strength are lowered. On the other hand, when the permeable porous film is thick, the mechanical strength becomes great, but the number of continuous pores decreases, so the permeability is lowered. For this reason, the thickness of the permeable porous film is desirably set at 10 to 1000 $\mu$m, and particularly desirably 20 to 100 $\mu$m.

Further, when the pore size of the permeable porous film is small, sometimes the permeability is lowered due to clogging or the like. On the other hand, when the pore size of the permeable porous film is large, sometimes it becomes difficult to trap the falling solids of the sublimating components explained later or sometimes the mechanical strength of the film is lowered. For this reason, for example, the permeable porous film is desirably given an average pore size of 0.1 to 20 $\mu$m, particularly desirably 0.5 to 1.0 $\mu$m. Note that, here, the "average pore size" means the average of the measurement values obtained by measuring the diameters of a plurality of (for example 10) pores by observation by a scanning electron microscope (SEM).

Further, when the permeability of the permeable porous film is low, the speed of passage of the gas generated by the heat treatment becomes slow and the heat treatment time becomes long. On the other hand, while there is no particular inconvenience if the permeability of the permeable porous film is high, generally the mechanical strength of the film is frequently lowered. For this reason, the air permeability is desirably set at for example $2 \times 10^{-4}$ to $2 \times 10^{-1}$ cm$^3$/(cm$^2$·s). Note that the "air permeability" represents the passage of a gas here and is measured according to JIS P-8117.

Note that the permeable porous film may be used alone or used in a combination of a plurality of types having different pore sizes for improving the passage efficiency. Further, the permeable porous film can be used bonded to a nonwoven fabric for reinforcement. The permeable porous film is affixed by using for example a metal frame and arranged at the trap 5.

It is also possible to provide a plurality of traps 5 between the stage 1 and the top plate 3b. When providing a plurality of traps 5, preferably for example a permeable porous film having a high permeability is provided at the stage 1 side and permeable porous films having lower permeabilities are sequentially provided at the top plate 3b side. By providing the traps 5 in this way, clogging or the like can be prevented, so the exhaust efficiency can be improved.

Note that when the sublimating components are cooled and solidified at the trap 5 and do not sufficiently pass through it, preferably a heater is attached between the trap 5 and the stage 1. For example, the heater can be provided in the body 3a between the trap 5 and the stage 1. By heating the vicinity of the trap 5 by using the heater in this way, the solidification of the sublimating components in the trap 5 can be prevented and passage can be improved.

Further, the case where the gas was exhausted from the exhaust port 4 was explained in the above description, but it is also possible to introduce nitrogen, air, or another carrier gas into the space formed by the stage 1 and the cover portion 3. The pressure of the carrier gas can be used to send the gas generated by the heat treatment to the exhaust port 4 in a short time.

Below, the operation of the heat treatment apparatus according to the first embodiment of the present invention will be explained with reference to FIG. 1. Note that, in FIG. 1, the solid arrows indicate the flow of the gas. In the present embodiment, first, a coating solution obtained by dissolving the photoresist film components is coated on the wafer W serving as the object to be heat-treated. Then, the stage 1 or the cover portion 3 is lowered or raised to expose the stage 1. The wafer W coated with the coating solution is placed on the stage 1 by a robot arm or other conveying means. After the wafer W is placed on the stage 1, the stage 1 or the cover portion 3 is raised or lowered to close off the stage 1. The wafer W placed on the stage 1 is then heated to a predetermined temperature by the heating unit 2 for pre-baking.

At this time, the pre-baking causes the solvent component of the coating solution coated on the wafer W to volatilize. When the solvent component volatilizes from the coating solution, the photoresist film is formed on the wafer W. To bond the photoresist film to the wafer W, post-baking is applied and the wafer W is heated again. Here, by the pre-baking and the post-baking, the low molecular-weight components and other sublimating components of the photoresist film components sublimate along with the volatilization of the solvent component.

The gaseous mixture containing the volatilized solvent component and sublimating components passes through the trap 5 and is exhausted from the exhaust port 4 as indicated by the arrows shown by the solid lines in the figure. Here, when it is sent to the exhaust port 4, the gas sometimes sticks to the top plate 3b or the like to form solids. In the conventional case, the trap 5 was not provided, so sometimes the sublimating components turning to solids on the top plate 3b or the like dropped down to the object to be heat-treated. In the first embodiment of the present invention, however, the falling solids are trapped by the trap 5. For this reason, the falling of solids to the wafer W or other heated object to be heat treated can be prevented.

As explained above, in the first embodiment of the present invention, even when sublimating components generated at the time of heat treatment form solids and drop down, the falling solids are trapped by the trap 5. For this reason, the present embodiment can prevent the falling of the solids to the object to be heat treated and can improve the yield of the product. Further, periodic maintenance can be facilitated, so the manufacturing efficiency can be made improved.

Further, in the present embodiment, a permeable porous film is used for the trap 5. Since the permeable porous film is a film, it is easy to handle and therefore maintenance of the heat treatment apparatus can be facilitated. Further, the present embodiment uses a fluorocarbon resin for the permeable porous film. A fluorocarbon resin is excellent in heat resistance and chemical resistance, so is hard to alter by heat or the volatilizing components and the sublimating components in the heat treatment. For this reason, in the present embodiment, lengthening of the replacement cycle of the permeable porous film becomes possible, so maintenance of the heat treatment apparatus can be facilitated.

Second Embodiment

Figure 2:
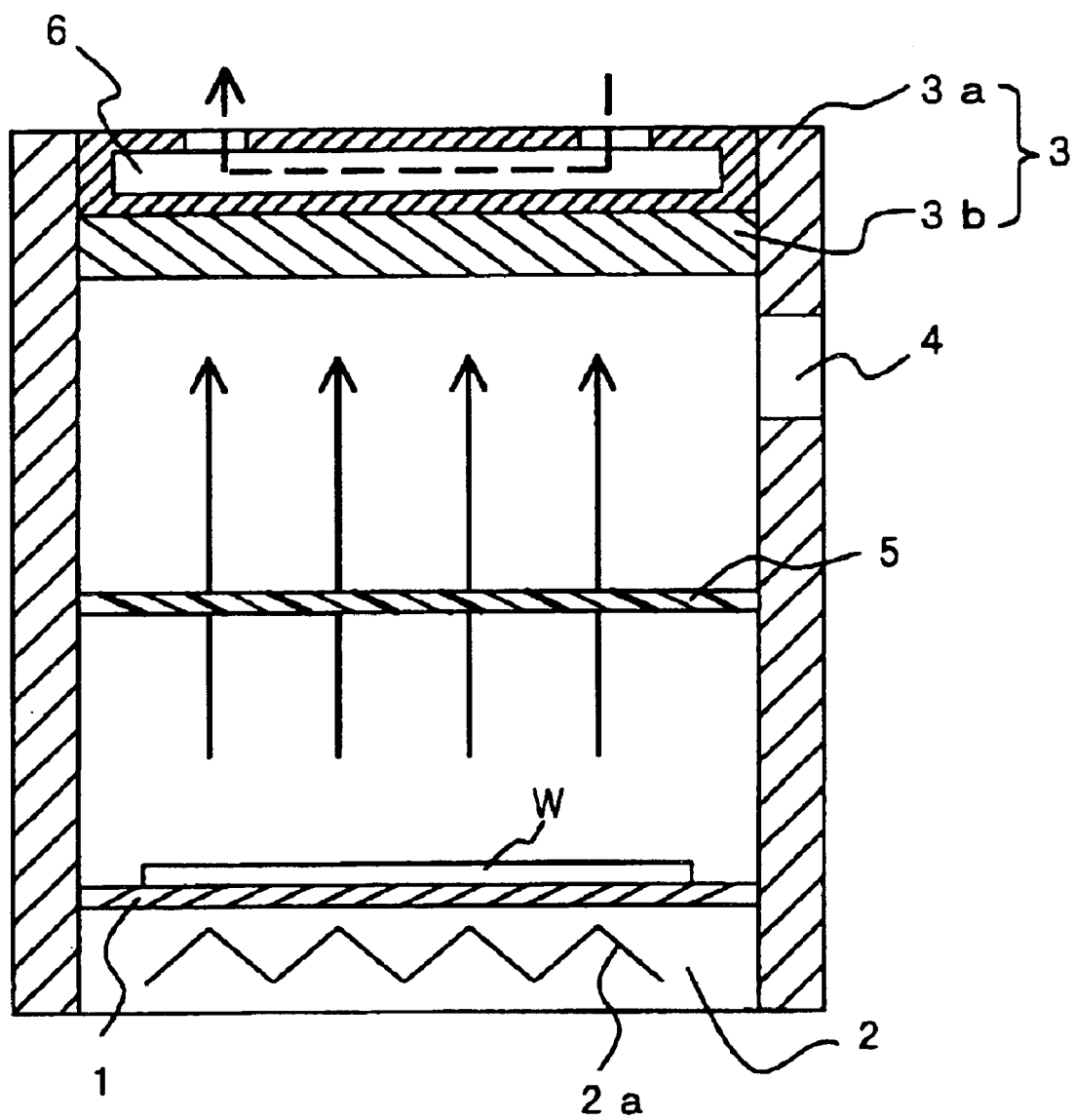
FIG. 2 is a schematic sectional view of a second embodiment of the present invention.

Next, an explanation will be given of a heat treatment apparatus according to a second embodiment of the present invention. FIG. 2 is a schematic vertical sectional view of the heat treatment apparatus according to the second embodiment. Portions common with those of the first embodiment explained above are given the same reference numerals, and explanations thereof are omitted.

The heat treatment apparatus according to the second embodiment is provided with a stage 1, a heating unit 2, a cover portion 3, an exhaust port 4, a trap 5, and a cooling unit 6. The cooling unit 6 is formed at the top plate 3b of the cover portion 3. Except for the fact that the cooling unit 6 is provided at the top plate 3b, this embodiment is the same as the first embodiment. Note that the stage 1, the heating unit 2, the cover portion 3, the exhaust port 4, the trap 5, and the cooling unit 6 in the present embodiment correspond to the stage, the heating unit, the cover, the exhaust port, the trap, and the cooling unit in the present invention.

The components will be explained in detail below. The cooling unit 6 is provided at the top plate 3b and cools the gas generated from the coating solution due to the heating of the object to be heat-treated. The cooling unit 6 is formed on the top plate 3b while facing the heating unit 2 as shown in the figure. Note that the cooling unit 6 may also be formed integrally with the top plate 3b. In this case, the cooling unit 6 is preferably provided in contact with the top plate 3b in order to improve the cooling efficiency. The cooling unit 6 is connected to for example a cooling water supply and has a function of circulating the cooling water supplied from the cooling water supply. Further, it is also possible to form the cooling unit 6 by for example an air cooling mechanism using a heat radiating plates or a fan.

Below, the operation of the heat treatment apparatus according to the second embodiment of the present invention will be explained while referring to FIG. 2. The solid arrows shown in FIG. 2 show the flow of the gas, and the broken arrows show the flow of the cooling water. Note that explanations of point common between the heat treatment apparatus according to the second embodiment and the heat treatment apparatus according to the first embodiment will be omitted.

In the same way as the first embodiment, due to the heating of the wafer W or other heated object coated with the coating solution, the sublimating components sublimate together with the volatilization of the solvent component of the coating solution. The gaseous mixture containing the volatilized solvent component and the sublimating components passes through the trap 5 and is exhausted from the exhaust port 4 as shown by the solid arrows in the figure. In the second embodiment, the cooling unit 6 circulates the cooling water supplied from the cooling water supply as indicated by the broken arrows to cool the top plate 3b. For this reason, the sublimating components in the gaseous mixture generated due to the heating pass through the trap 5 and are helped to solidify at the top plate 3b cooled by the cooling unit 6. Accordingly, the sublimating components in the exhaust exhausted from the exhaust port 4 are reduced. For this reason, the deposition of the sublimating components at the exhaust duct and the inside of the exhaust treatment apparatus is reduced. Note that while the solidification of the sublimating components is promoted by the cooling unit 6 and amount of solids falling to the wafer W side increases, the solids can be trapped by the trap 5 in the same way as the first embodiment, so no disadvantage arises.

As explained above, in the second embodiment of the present invention, by providing the cooling unit 6 at the top plate 3b, the solidification of the sublimating components passing through the trap 6 is promoted by the cooling unit 6. For this reason, in the present embodiment, the sublimating components in the exhaust exhausted from the exhaust port 4 can be reduced, the fouling of the exhaust duct and the exhaust treatment apparatus can be prevented, and the exhaust treatment efficiency can be improved.

Third Embodiment

Figure 3:
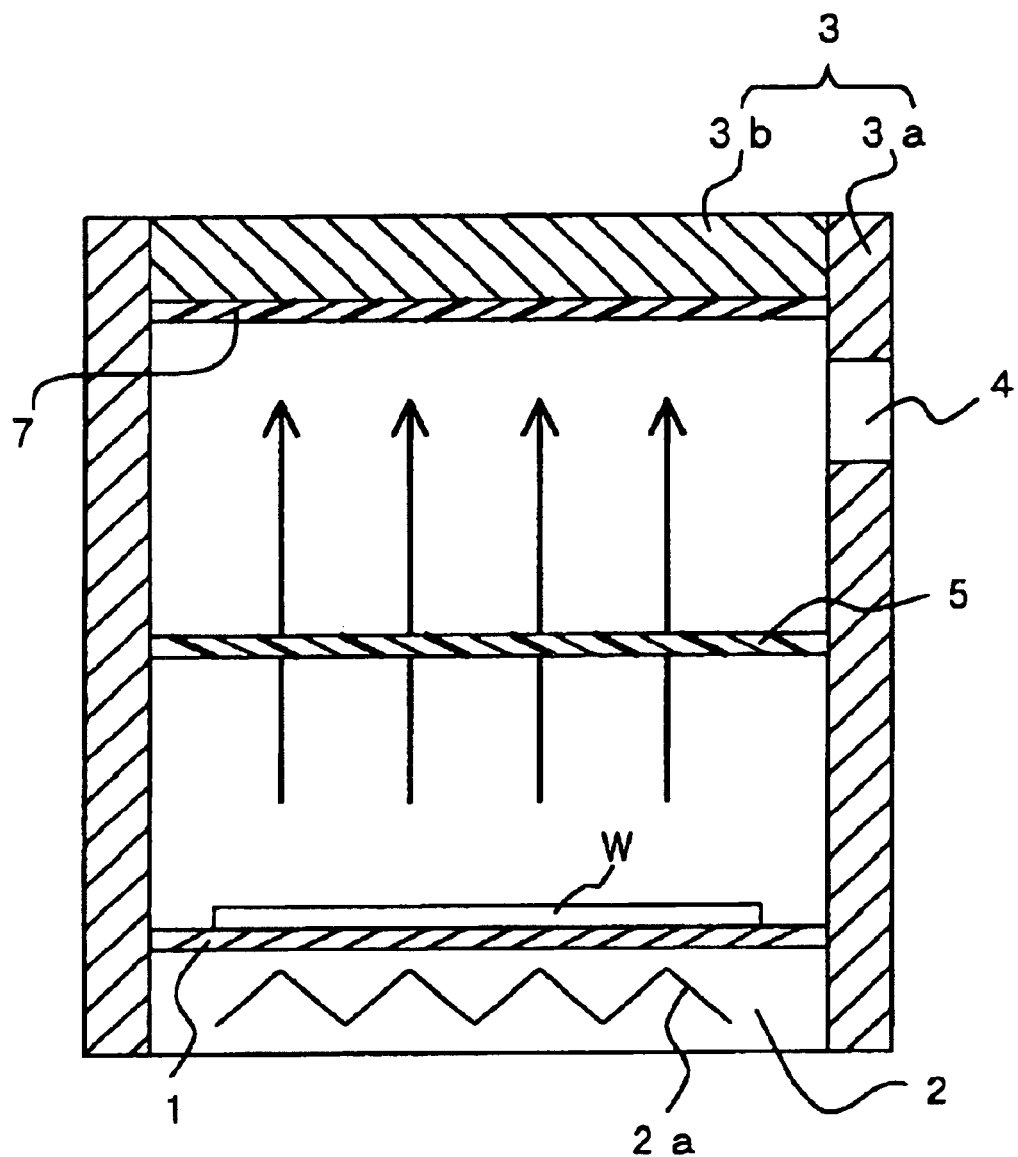
FIG. 3 is a schematic sectional view of a third embodiment of the present invention.

Next, an explanation will be given of a heat treatment apparatus according to a third embodiment of the present invention. FIG. 3 is a schematic vertical sectional view of the heat treatment apparatus according to the third embodiment. Portions common with those of the first embodiment explained above are given the same reference numerals and explanations thereof are omitted.

The heat treatment apparatus according to the third embodiment is provided with a stage 1, a heating unit 2, a cover portion 3, an exhaust port 4, a trap 5, and a protective part 7. Except for the provision of the protective part 7, this embodiment is the same as the first embodiment. Note that the stage 1, the heating unit 2, the cover portion 3, the exhaust port 4, the trap 5, and the protective part 7 in the present embodiment correspond to the stage, the heating unit, the cover, the exhaust port, the trap, and the protective part in the present invention.

The components will be explained in detail below. The protective part 7 is formed between the trap 5 and the top plate 3b and is provided with a nonpermeable film. Here, the "nonpermeable film" is a film that does not have pores passing straight through it from the front to the back unlike a permeable porous film and does not pass gas therethrough. Concretely, for example, polyethylene, polypropylene, or another polyolefin-based resin, a polyamide-based resin, cellulose acetate or another cellulose-based resin, and polytetrafluoroethylene or another fluorocarbon resin is used. When heat treating under high temperature (250° C.) conditions, in the same way as the above permeable porous film, a nonpermeable film using a fluorocarbon resin is preferred. For this reason, in the present embodiment, a nonpermeable film of for example fluorocarbon resin is used. The nonpermeable film is provided at the protective part 7 while being affixed by using a metal frame. It is also possible to bond the nonpermeable film to the top plate 3b by using an adhesive or the like to form the protective part 7.

Note that the thickness of the nonpermeable film can be desirably set according to the heat treatment conditions such as the heat treatment temperature, the heat treatment time, and the properties of the coating solution. When the nonpermeable film is thin, the mechanical strength is lowered. On the other hand, even if the nonpermeable film is made thick, there is no particular inconvenience, so the film may be formed to a thickness great enough to protect the top plate 3b. For example, preferably it is formed to 10 to 1000 $\mu$m and is particularly desirably formed to 20 to 100 $\mu$m.

Below, the operation of the heat treatment apparatus according to the third embodiment of the present invention will be explained with reference to FIG. 3. The solid arrows shown in FIG. 3 show the flow of the gas. Note that explanations of common points between the heat treatment apparatus according to the second embodiment and the heat treatment apparatus according to the first embodiment will be omitted.

In the same way as the first embodiment, due to the heating of the wafer W or other heated object coated with the coating solution, the sublimating components sublimate along with the volatilization of the solvent component of the coating solution. As indicated by the solid arrows in the figure, the gaseous mixture containing the volatilized solvent component and the sublimating components passes through the trap 5 and is exhausted from the exhaust port 4. In the third embodiment, when the gas is sent to the exhaust port 4, it deposits and solidifies on the nonpermeable film of the protective part 7 provided at the top plate 3b. Since the sublimating components deposit at the nonpermeable film in this way, deposition of the sublimating components at the top plate 3b is prevented. The sublimating components deposited on the nonpermeable film are easily removed by replacing the nonpermeable film.

As explained above, the third embodiment of the present invention can prevent the deposition of the sublimating components at the top plate 3b by providing the protective part 7 provided with the nonpermeable film between the trap 5 and the top plate 3b. For this reason, in the present embodiment, since the nonpermeable film does not pass gas, the deposition of the sublimating components at the top plate 3b can be prevented and maintenance of the heat treatment apparatus can be facilitated.

Fourth Embodiment

Next, an explanation will be given of a heat treatment apparatus according to a fourth embodiment of the present invention. FIG. 4 is a schematic vertical sectional view of the heat treatment apparatus according to the fourth embodiment. Portions common with those of the first embodiment explained above are given the same reference numerals and explanations thereof will be omitted.

The heat treatment apparatus according to the fourth embodiment is provided with a stage 1, a heating unit 2, a cover portion 3, an exhaust port 4, and a trap 5. Here, the trap 5 has a trap mount 11 and a trap holder 12 and is detachably provided. Except for the trap 5 being detachably provided, this embodiment is the same as the first embodiment. Note that the stage 1, the heating unit 2, the cover portion 3, the exhaust port 4, and the trap 5 in the present embodiment correspond to the stage, the heating unit, the cover, the exhaust port, and the trap in the present invention.

The components will be explained in detail below. The trap mount 11 and the trap holder 12 are formed so as to grip the trap 5. The trap mount 11 and the trap holder 12 are formed by using metal frames having the same shape as the shape of for example the body 3a. For example, in the case of a cylindrical body 3a, use is made of disk-shaped metal frames. A metal frame provided with a recess is used for the trap mount 11 and secured to the trap 5. On the other hand, a disk-shaped metal frame having a projection is used for the trap holder 12. The projection of the metal frame of the trap holder 12 is fit into the recess of the trap mount 11. The trap 5 is provided between the trap mount 11 and the trap holder 12. By fitting together the recess of the trap mount 11 and the projection of the trap holder 12 to support the trap 5 in this way, the trap 5 can be detachably provided.

Note that it is also possible to form the trap mount 11 to a shape drawn out from the inside of the cover portion 3. By drawing the trap mount 11 out from the inside of the cover portion 3, the trap 5 supported on the trap mount 11 can be easily exposed to the outside, so maintenance such as replacement becomes easy.

Below, the operation of the heat treatment apparatus according to the fourth embodiment of the present invention will be explained with reference to FIG. 4. The solid arrows shown in FIG. 4 show the flow of the gas. Note that explanations of common points between the heat treatment apparatus according to the third embodiment and the heat treatment apparatus according to the first embodiment will be omitted.

In the same way as the first embodiment, due to the heating of the wafer W or other heated object coated with the coating solution, the sublimating components sublimate along with the volatilization of the solvent component of the coating solution. The gaseous mixture containing the volatilized solvent component and the sublimating components passes through the trap 5 as indicated by the solid arrows in the figure and is exhausted from the exhaust port 4. The passed sublimating components sometimes form solids at the top plate 3b or the like which drop down to the wafer W. However, the trap 5 can trap the fallen solids, so falling to the object can be prevented. Here, in the fourth embodiment, the trap 5 is detachably supported between the trap mount 11 and the trap holder 12. For this reason, the trap 5 can be easily detached from the trap mount 11 at the time of replacement or other maintenance.

As explained above, in the fourth embodiment of the present invention, by detachably providing the trap 5, the replacement of the trap 5 can be facilitated. For this reason, the present embodiment enables easy maintenance of the heat treatment apparatus.

Note that the effects of the present embodiment are the same even when the protective part 7 is detachably provided.

Fifth Embodiment

Next, an explanation will be given of a heat treatment apparatus according to a fifth embodiment of the present invention. FIG. 5 is a schematic vertical sectional view of the heat treatment apparatus according to the fifth embodiment. Portions common with those of the first embodiment explained above are given the same reference numerals and explanations thereof will be omitted.

The heat treatment apparatus according to the fifth embodiment is provided with a stage 1, a heating unit 2, a cover portion 3, an exhaust port 4, and a trap 5. Further, it is provided with a unwinder 21 for unwinding permeable porous film wound in the form of a roll to the trap 5 and a winder 22 for winding the permeable porous film fed out from the unwinder 21. Except for the provision of the unwinder 21 and the winder 22, this embodiment is the same as the first embodiment. Note that the stage 1, the heating unit 2, the cover portion 3, the exhaust port 4, the trap 5, the unwinder 21, and the winder 22 in the present embodiment correspond to the stage, the heating unit, the cover, the exhaust port, the trap, the unwinder, and the winder in the present invention.

The components will be explained in detail below. The roll of the permeable porous film is formed by for example winding up a flat permeable porous film around a cylindrical paper tube. The roll of the permeable porous film is positioned by inserting the paper tube over the unwinder roll 21b of the unwinder 21. The permeable porous film is fed out from that roll and supplied to the trap 5 through a gap between unwinder conveying rollers 21a disposed so as to face each other. The permeable porous film from the trap 5 is then passed between winder conveying rollers 22a disposed facing each other. The permeable porous film is then taken up at a paper tube inserted over the winder roll 22b of the winder 22.

The winder 22 winds the permeable porous film from the unwinder 21, so has a function of rotating the winder roll 22b. The winder 22 automatically replaces the permeable porous film by this drive function. Further, the unwinder 21 gives tension to the permeable porous film by a brake function to substage convey the permeable porous film. By giving the tension to the permeable porous film by the unwinder 21, meandering or other undesirable conveyance is prevented and the sublimating components trapped by the trap 5 are prevented from falling again and depositing at the wafer W.

Note that when automating the replacement of the permeable porous film, in order to detect the end of a roll, preferably an end film for passing light or reflecting light is provided near the core of the roll. For example, by making the light transmittance or the light reflectivity different between the permeable porous film and the end film, it is possible to detect the difference of the light transmittance by a photo sensor to decide the presence of the permeable porous film. By setting the system so that the heat treatment apparatus is automatically stopped when it can no longer supply the permeable porous film from the unwinder 21, an inconvenience such as heat treatment being carried out in a state where there is no permeable porous film in the trap 5 can be prevented.

Below, the operation of the heat treatment apparatus according to the fifth embodiment of the present invention will be explained while referring to FIG. 5. the solid arrows indicating the direction from the wafer W to the top plate 3b in FIG. 5 show the flow of the gas. Further, the arrows shown at the unwinder 21 and the winder 22 show the rotation direction of the roll and the conveyance direction of the permeable porous film. Note that explanations of points common between the heat treatment apparatus according to the fourth embodiment and the heat treatment apparatus according to the first embodiment will be omitted.

In the same way as the first embodiment, due to the heating of the wafer W or other heated object coated with the coating solution, the sublimating components sublimate along with the volatilization of the solvent component of the coating solution. The gaseous mixture containing the volatilized solvent component and the sublimating components passes through the permeable porous film provided in the trap 5 and is exhausted from the exhaust port 4 as indicated by the solid arrows in the figure. Sometimes the passed sublimating components solidify at the top plate 3b or the like and drop down to the wafer W. However, the falling sublimating components can be trapped by the permeable porous film of the trap 5, so falling to the object can be prevented. In the fifth embodiment, the permeable porous film trapping the sublimating components etc. is taken up by the winder 22 by rotation of the winder roll 22b as indicated by the lines. Simultaneously, new permeable porous film is supplied from the unwinder 21 to the trap 5. For this reason, in the present embodiment, the replacement of the permeable porous film is easy.

As explained above, in the fifth embodiment of the present invention, by forming a flat permeable porous film into a roll and feeding out this permeable porous film, it is possible to supply the film to the trap 5. For this reason, in the present embodiment, the replacement of the permeable porous film becomes easy, the production efficiency is improved, and maintenance of the apparatus is facilitated.

Note that the effects of the present embodiment are the same even when a unwinder for unwinding flat nonpermeable film formed in a roll to the protective part 7 and a winder for winding the nonpermeable film fed out from the unwinder are provided.

Summarizing the effects of the present invention, as explained above, according to the heat treatment apparatus of the present invention, the following effects are exhibited.

According to the present invention, even when sublimating components produced from the coating solution at the time of heat treatment solidify and drop down, they can be trapped by the permeable porous film and falling to the object can be prevented. For this reason, product defects caused by the falling sublimating components can be prevented. Accordingly, the present invention can improve the yield of the product and improve reliability. Further, the present invention can facilitate the periodic maintenance, so can raise the production efficiency.

While the invention has been described with reference to specific embodiments chosen for purpose of illustration, it should be apparent that numerous modifications could be made thereto by those skilled in the art without departing from the basic concept and scope of the invention.

The present disclosure relates to subject matter contained in Japanese Patent Application No. 2002-359661, filed on Dec. 11, 2002, the disclosure of which is expressly incorporated herein by reference in its entirety.

What is claimed is:

1. A heat treatment apparatus comprising:
    a stage for placing an object to be heat-treated and coated by a coating solution;
    a heating unit for heating the object placed on the stage and coated by the coating solution from beneath the stage;
    a cover portion having a body provided at surrounding sides of the stage, a top plate for closing an upper opening of the body, and an exhaust port from which a gas generated from the coating solution due to the heating of the object is exhausted and covering the object placed on the stage; and
    a trap provided between the stage and the top plate, passing the gas generated from the coating solution due to the heating of the object therethrough, and trapping the solids solidified and dropping down after the passage, wherein
    the exhaust port is located above the location where the trap is provided.

2. A heat treatment apparatus as set forth in claim 1, wherein the trap has a permeable porous film.

3. A heat treatment apparatus as set forth in claim 1, wherein a cooling unit for cooling gas generated from the coating solution due to the heating of the object is provided at the top plate.

4. A heat treatment apparatus as set forth in claim 1, wherein a protective part having a nonpermeable film is provided between the trap and the top plate.

5. A heat treatment apparatus as set forth in claim 1, wherein the trap is provided detachably.

6. A heat treatment apparatus as set forth in claim 2, wherein a fluorocarbon resin is used as the permeable porous film.

7. A heat treatment apparatus as set forth in claim 2, further comprising:
    a unwinder for unwinding the permeable porous film wound up in a roll to the trap, and
    a winder for winding the permeable porous film unwinded from the unwinder.

8. A heat treatment apparatus as set forth in claim 4, wherein the protective part is provided detachably.

9. A heat treatment apparatus as set forth in claim 4, further comprising:
    a unwinder for unwinding the permeable porous film wound up in a roll to the trap, and
    a winder for winding the permeable porous film fed out from the unwinder.

10. A method of heat treatment using a heat treatment apparatus, said apparatus comprising a stage for placing an object to be heat-treated and coated by a coating solution; a heating unit for heating the object placed on the stage and coated by the coating solution from beneath the stage; a cover portion having a body provided at surrounding sides of the stage, a top plate for closing an upper opening of the body, and an exhaust port from which a gas generated from the coating solution due to the heating of the object is exhausted and covering the object placed on the stage; and a trap provided between the stage and the top plate, passing the gas generated from the coating solution due to the heating of the object therethrough, and trapping the solids solidified and dropping down after the passage, the exhaust port being located above the location where the trap is provided,
    said method comprising the steps of:
    placing the object to be heat-treated on the stage; and
    heating the object,
    to thereby pass a gas generated from the coating solution by the heating through the trap, and trap the solids solidified on a dropping down.

11. A method of heat treatment as set forth in claim 10, wherein in the trap step, a permeable porous film is used.

12. A method of heat treatment as set forth in claim 10, further comprising a step of cooling gas generated from the coating solution due to the heating of the object is provided at the top plate.

13. A method of heat treatment as set forth in claim 10, wherein a protective part having a nonpermeable film is provided between the trap and the top plate.

14. A method of heat treatment as set forth in claim 10, wherein the trap is provided detachably.

15. A method of heat treatment as set forth in claim 11, wherein, in the trap step, a fluorocarbon resin is used as the permeable porous film.

16. A method of heat treatment as set forth in claim 11, further comprising the steps of:
    for unwinding the permeable porous film wound up in a roll to the trap by a unwinder, and
    winding the permeable porous film unwinded from the unwinder by a winder.

17. A method of heat treatment as set forth in claim 13, wherein the protective part is provided detachably.

18. A method of heat treatment as set forth in claim 13, further comprising the steps of:
    unwinding the permeable porous film wound up in a roll to the trap by a unwinder, and
    a winder for winding the permeable porous film fed out from the unwinder by a winder.

* * * * *